United States Patent [19]

Dobkin

[11] 4,126,826

[45] Nov. 21, 1978

[54] MEASUREMENT SYSTEM SIGNAL ISOLATION

[75] Inventor: Robert C. Dobkin, San Mateo, Calif.

[73] Assignee: National Semiconductor Corporation, Santa Clara, Calif.

[21] Appl. No.: 834,860

[22] Filed: Sep. 19, 1977

[51] Int. Cl.² .......................... G01R 1/20; G01K 7/20
[52] U.S. Cl. ................................ 324/127; 73/362 SC; 307/310; 324/117 R
[58] Field of Search ........................... 324/127, 117 R; 73/362 R, 362 AR, 362 SC; 307/310

[56] References Cited

U.S. PATENT DOCUMENTS

| | | | |
|---|---|---|---|
| 3,422,352 | 1/1969 | Paulkovich | 324/117 R |
| 3,742,764 | 7/1973 | Dauphinee | 73/362 AR |

*Primary Examiner*—Rudolph V. Rolinec
*Assistant Examiner*—Ernest F. Karlsen
*Attorney, Agent, or Firm*—Gail W. Woodward

[57] ABSTRACT

A transformer primary is first biased with a current sustained at least long enough for any secondary voltage to drop to zero. Then the primary is open circuited. The resultant secondary voltage is coupled to a constant voltage device such as a shunt regulator. A voltage related to the shunt regulator voltage will then appear in the open circuited primary and will be available for measurement fully isolated from the secondary. If the shunt regulator is made to operate as a function of a condition to be measured, an isolated remote measure of the condition is present at the primary of the transformer.

9 Claims, 3 Drawing Figures

MEASUREMENT SYSTEM SIGNAL ISOLATION

BACKGROUND OF THE INVENTION

The invention relates to remote indication or measurement of a condition wherein isolation is required. In many cases a condition is to be remotely indicated where isolation is necessary. For example, the conditions on a high voltage system are to be read at a low voltage location. Alternatively, an inaccessible location is to be monitored remotely for a condition such as temperature, pressure, flow rate, or the like. Typically, isolation is achieved using transformer coupled transducers, amplifiers, or repeaters which must be powered. Also, light beam coupled systems have been used for isolation. Most systems require powered transducer equipment at both the isolated and the measurement sensing locations. Such systems may require separate power supplies and are complicated.

SUMMARY OF THE INVENTION

It is an object of the invention to provide isolation between a sensing location and a measurement location using a simple transformer and pulse excitation.

It is a further object of the invention to employ a constant voltage device responsive to a condition coupled to the secondary of a transformer that has a measurement capability in the primary with condition sensing to be achieved without resorting to the use of a power supply in the secondary circuit.

These and other objects are achieved by the use of a condition responsive constant voltage device. This device produces a constant voltage drop across its terminals with the voltage magnitude being set by an input function. A zener diode is typical of such a device where temperature will determine the constant voltage magnitude. The constant voltage device is coupled to the secondary of a transformer, the primary of which is coupled to the pulsed source of current. A current is passed through the transformer primary until the secondary voltage reaches zero. A forward biased diode across the secondary will assure a rapid action. Then, when the primary current is interrupted, the secondary voltage will rise to the constant voltage level to produce a secondary pulse equal in peak amplitude to the constant voltage set by the condition to be monitored. The same pulse amplitude will appear across the primary or any other secondary, as modified by the transformer turns ratio, where an isolated measurement can be taken.

DESCRIPTION OF THE INVENTION

Figure 1:
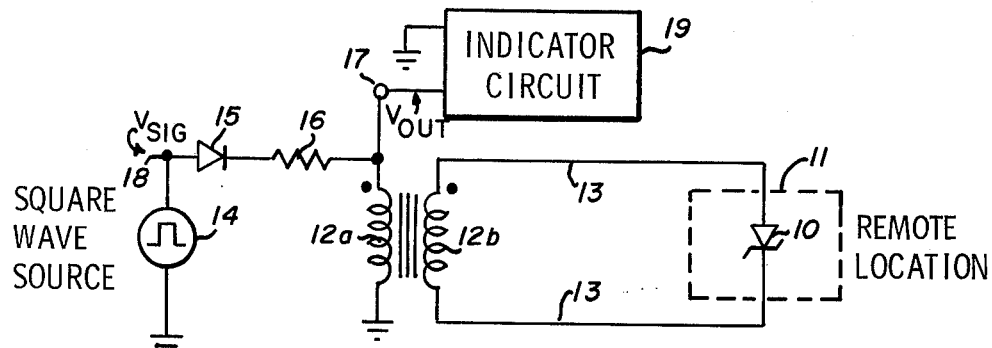
FIG. 1 is a schematic-block diagram showing the elements of the invention using a zener diode.

FIG. 1 shows the simplest form of the invention. A zener diode 10 is shown located at a remote location designated 11. It will be assumed that the zener diode is at the thermal ambient of its surroundings. It is well known that the actual reverse breakdown voltage of a zener diode is a function of temperature. For example, a typical silicon zener operating at about 7 volts will have a temperature coefficient of about 3 mv per degree centigrade. Any given diode can be calibrated precisely if desired to act as a temperature transducer.

Zener diode 10 is coupled to secondary winding 12b of transformer 12 by means of a pair of wires or transmission line 13 which can, if desired, be a simple twisted pair. Primary winding 12a is coupled to a signal source 14 by way of isolating diode 15 and resistor 16. Source 14 may be a square wave generator or a pulse generator. It must have a period that exceeds the charging current time constant to be described below and an amplitude sufficient to drive the zener diode 10 into its reverse breakdown.

Figure 2:
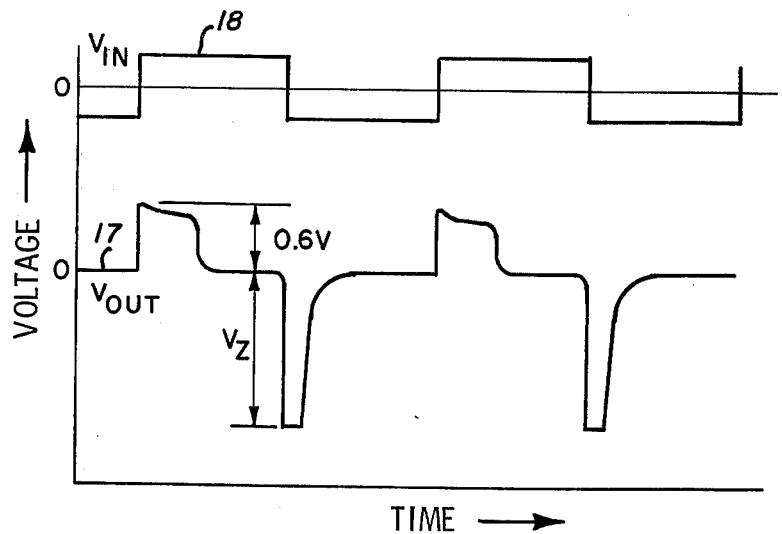
FIG. 2 is a waveform diagram showing the operation of the circuit of FIG. 1.

Waveform 18 of FIG. 2 represents $V_{IN}$ circuit node 18. Waveform 17 represents the voltage at terminal 17 labeled $V_{OUT}$. In the following discussion it will be assumed that transformer 12 has a unity turns ratio although other ratios can be employed. It is to be understood that the waveforms of FIG. 2 are not to the same scale. The upper waveform 18 is in practice much larger than waveform 17, which is expanded for clarity.

As node 18 is driven positive, diode 15 will conduct and current flow, limited by resistor 16, will flow in primary 12a. This will induce a voltage into the secondary 12b that will forward bias zener diode 10. For a silicon diode that secondary voltage will limit at about 0.6 volt as shown. The positive 0.6 volt pulse will have a duration dertermined by the L/R time constant of the circuit. The L or inductance is contributed by the transformer and the R or resistance is contributed primarily by resistor 16. As a practical matter the period of source 14 is made longer than the width of the positive pulse as illustrated in FIG. 2.

The positive excursion of the input thus acts to charge the transformer inductance which means that a magnetic field is established. On the negative input excursion, diode 15 decouples source 14 from the circuit and the magnetic field will collapse, thus inducing an opposite polarity signal as shown. The signal magnitude will be limited by the reverse breakdown of zener diode 10. When diode 10 is driven into reverse breakdown it will act to clamp the voltage across the 12b winding. The negative pulse amplitude will be equal to the zener voltage $V_Z$. Since transformer 12 has unity turns ratio, the same pulse will appear at terminal 17. An indicator circuit 19, which could be a simple negative peak reading voltmeter, will then record a potential equal to $V_Z$ at location 11. This potential can be calibrated in terms of the temperature at 11.

From the above, it can be seen that a remote location temperature reading can be obtained. Since a transformer is used, the remote location can be at a substantial potential difference, for example, a high voltage location. Also, the location can be inaccessible with only a pair of connections needed for operation. Since pulsed operation is employed, heating of the zener diode can be minimized so that heating due to the measurement itself does not need to be compensated.

Figure 3:
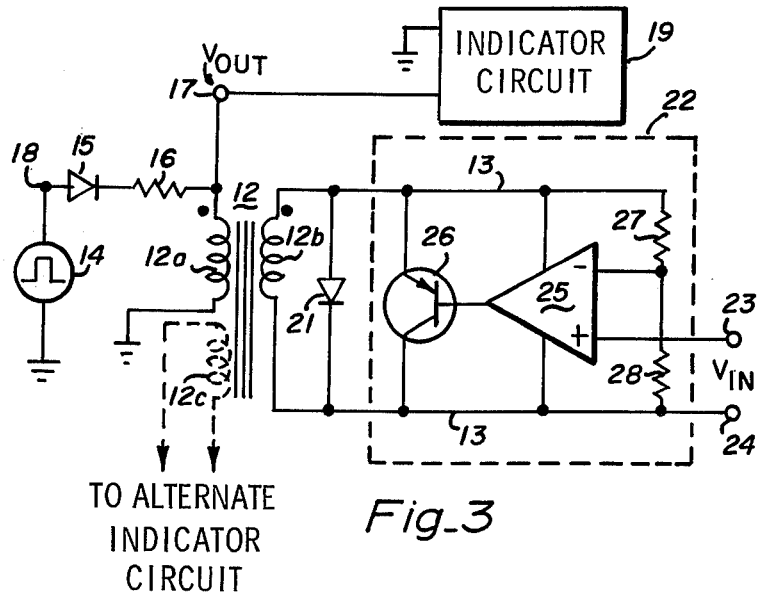
FIG. 3 is a schematic-block diagram showing the elements of the invention using a voltage-controlled shunt regulator.

FIG. 3 shows a more versatile system in which an analog voltage input is available for the measurement function. The circuit inside dashed block 22 is a constant voltage device with the magnitude of the constant voltage being responsive to the direct current potential at the $V_{IN}$ terminals 23–24. A high gain operational amplifier 25 is coupled to the base of transistor 26 which is connected in shunt across the line 13. The juncture of resistors 27 and 28, which are series connected across line 13, is coupled to the inverting input (−) thus providing a negative feedback. Terminal 23 is coupled to the noninverting input (+). When transformer 12 drives the emitter of transistor 26 positive with respect to the collector, the inverting input of amplifier 25 will be driven positive with respect to terminal 24 by a fraction set by the values of resistors 27 and 28. In operation transistor 26 will be driven into conduction to an extent that will insure that the potential at the juncture of resistors 27 and 28 is equal to the potential at terminal 23. Thus, the circuitry inside box 22 will operate at a constant potential established by the potential across the $V_{IN}$ terminals. The actual limiting value is:

$$V_{LIMIT} = V_{IN}(1 + \frac{R27}{R28}) \quad (1)$$

where
 $R27$ is the value of resistor 27
 $R28$ is the value of resistor 28.
In the case where resistors 27 and 28 are equal the constant voltage is twice the value of $V_{IN}$.

Diode 21 is poled to conduct in its forward direction for the other polarity of the operating cycle where the constant voltage circuit is inoperative. The circuit operates as that of FIG. 1 to produce a negative pulse at terminal 17 $V_{OUT}$ and the waveforms of FIG. 2 apply. With a unity turns ratio in transformer 12, $V_{LIMIT}$ of equation (1) is equal to $V_{OUT}$ (or $V_Z$ of FIG. 2).

The dashed winding 12c illustrates an alternative means for measurement. Indicator circuit 19 can be connected to winding 12c instead of the primary winding as shown. In this case, the indicating circuit is fully isolated from the input as well as the constant voltage circuit.

The circuit of FIG. 3 can act to transduce $V_{IN}$ to $V_{OUT}$ in terms of an analog voltage that can represent any desired quantity. The actual measurement will be determined by the kind of transducer coupled to $V_{IN}$. Typical analog voltages can be generated by transducers of temperature, pressure, current, velocity, voltage, power, or other as is well known in the art.

If desired elements 21 and 22 of FIG. 3 could be replaced by other constant voltage integrated-circuit devices. For example, a circuit similar to an LM135 (manufactured by National Semiconductor Corporation) can be connected to simulate a zener diode characteristic and made to have 10 mv/degree C. temperature coefficient.

My invention has been described in its basic and preferred forms and the circuits required to implement it set forth. Clearly, there are alternatives and equivalents that will occur to a person skilled in the art. For example, other rectifying and constant voltage devices could be used. Accordingly, it is intended that the scope of the invention be limited only by the claims that follow.

I claim:

1. Measurement means for sensing at a first location a condition at a second location wherein said first and second locations may be electrically isolated, said measurement means comprising:
 means for developing a constant voltage of a magnitude related to said condition in response to current flow in one direction and for developing a state of high conduction in response to current flow in a direction opposite to said one direction;
 a transformer having a secondary winding coupled to said means for developing and a primary winding;
 means for coupling a source of pulsed signal energy to said primary winding; and
 means coupled to said transformer for determining the peak voltage across said means for developing a constant voltage when said source of pulsed signal energy causes current to flow in said one direction.

2. The measurement means of claim 1 wherein said means for determining and said source of pulsed signal energy are coupled to the same winding on said transformer.

3. The measurement means of claim 2 wherein said means coupled to said transformer is a negative peak reading voltmeter and said source of pulsed signal energy applies a positive pulse to said transformer.

4. The measurement means of claim 2 wherein said means coupled to said transformer is a positive peak reading voltmeter and said source of pulsed signal energy applies a negative pulse to said transformer.

5. The measurement means of claim 1 wherein said means for determining and said source of pulsed signal energy are coupled to separate windings on said transformer.

6. The measurement means of claim 1 wherein said means for developing a constant voltage is a two terminal shunt regulator comprising:
 a transistor having its emitter collector circuit coupled across said two terminals and a base electrode;
 an operational amplifier having its output coupled to said base, an inverting input coupled to the juncture of a pair of resistors series coupled across said terminals, and a noninverting input coupled to a source of potential set by said condition; and
 a diode coupled across said two terminals and poled to conduct in its forward direction to achieve said state of high conduction.

7. The measurement means of claim 1 wherein said means for developing a constant voltage comprises a zener diode and said condition is temperature.

8. The measurement means of claim 1 wherein said means for developing a constant voltage comprises an integrated circuit which displays a zener diode characteristic and which has an adjustable voltage coefficient of temperature.

9. The measurement means of claim 1 wherein said means for developing a constant voltage comprises an integrated circuit which displays a zener diode characteristic with substantially zero temperature coefficient and has an adjustable breakdown voltage.

* * * * *